(12) United States Patent
Fitzgibbon

(10) Patent No.: US 7,420,347 B2
(45) Date of Patent: Sep. 2, 2008

(54) SYSTEM AND METHOD FOR USING A CAPACITIVE DOOR EDGE SENSOR

(75) Inventor: James J. Fitzgibbon, Batavia, IL (US)

(73) Assignee: The Chamberlain Group, Inc., Elmhurst, IL (US)

( * ) Notice: Subject to any disclaimer, the term of this patent is extended or adjusted under 35 U.S.C. 154(b) by 0 days.

(21) Appl. No.: 10/958,181

(22) Filed: Oct. 4, 2004

(65) Prior Publication Data

US 2006/0071624 A1 Apr. 6, 2006

(51) Int. Cl.
G05B 5/00 (2006.01)
H02H 7/08 (2006.01)
H02P 1/04 (2006.01)
H02P 3/00 (2006.01)
H02P 7/00 (2006.01)

(52) U.S. Cl. ............... 318/478; 318/450; 318/466; 318/467

(58) Field of Classification Search ........... 49/26–28, 49/13–14, 31, 467; 160/29, 4, 40–43; 318/465–478, 318/264–266
See application file for complete search history.

(56) References Cited

U.S. PATENT DOCUMENTS

| 4,453,112 | A | * | 6/1984 | Sauer et al. | .......... 318/281 |
| 5,625,980 | A | | 5/1997 | Teich et al. | |
| 6,082,046 | A | * | 7/2000 | Simmons | .......... 49/26 |
| 6,377,009 | B1 | * | 4/2002 | Philipp | .......... 318/468 |
| 6,452,541 | B1 | | 9/2002 | Zhao et al. | |
| 6,466,036 | B1 | | 10/2002 | Philipp | |
| 6,651,385 | B2 | * | 11/2003 | Miller et al. | .......... 49/27 |
| 6,782,759 | B2 | * | 8/2004 | Shank et al. | .......... 73/780 |
| 6,851,222 | B2 | * | 2/2005 | Albiero | .......... 49/27 |
| 6,920,717 | B2 | * | 7/2005 | Miller et al. | .......... 49/27 |

FOREIGN PATENT DOCUMENTS

| DE | 3423132 C1 | 1/1986 |
| EP | 1 325 481 A1 | 7/2003 |
| EP | 1 332 481 A1 | 8/2003 |
| FR | 2596798 A1 | 10/1987 |
| WO | 2002/29747 A1 | 4/2002 |
| WO | 2002/29748 A1 | 4/2002 |
| WO | WO 2004/001438 A2 | 12/2003 |

* cited by examiner

Primary Examiner—Lincoln Donovan
Assistant Examiner—Erick Glass
(74) Attorney, Agent, or Firm—Fitch, Even, Tabin & Flannery

(57) ABSTRACT

A system and method for sensing capacitance at the edge of a movable barrier and for detecting an obstruction includes positioning a conductive member within or about a holder. A sensed capacitance between the conductive member and ground. A controller is coupled to the sensor. The controller determines whether an obstruction exists within a path of the barrier by analyzing the sensed capacitance. The conductive member and holder move away from a physical reference as the physical reference is approached such that the sensed capacitance between the conductive member and the physical reference remains below a predetermined threshold.

21 Claims, 3 Drawing Sheets

SYSTEM AND METHOD FOR USING A CAPACITIVE DOOR EDGE SENSOR

FIELD OF THE INVENTION

The field of the invention generally relates to methods and devices for controlling movable barrier operators. More specifically, the invention relates to detecting obstructions in the pathways of moveable barriers.

BACKGROUND OF THE INVENTION

Barrier movement operators are automated systems which are used to move a barrier with respect to an opening. Examples of barriers to be moved include garage doors, gates, fire doors and rolling shutters. A number of barrier movement operators have been sold over the years most of which include a head unit containing a motor connected to a transmission. The transmission, which may include, for example, a belt drive, a chain drive, a screw drive or extendible arm is then coupled to the barrier for opening and closing.

Such barrier movement operators also typically include a wall control unit, which is connected to send signals to the head unit thereby causing the head unit to open and close the barrier. In addition, these operators often include a receiver unit at the head unit to receive wireless transmissions from a hand-held code transmitter or from a keypad transmitter, which may be affixed to the outside of the area closed by the barrier or other structure.

Obstructions may exist or may enter the pathway of the moveable barrier. Previous systems have allowed the barrier operator systems to determine if an obstruction has been encountered and to either stop or reverse the direction of the travel of the barrier once this determination has been made. For instance, some previous systems measured the force applied to the barrier by the motor. The systems then compared the measured force to an expected value plus a fixed cushion value. If the comparison indicated that the measurement value exceeded the expected value plus the cushion value (together, a threshold value), then the downward barrier movement was reversed. These systems typically determined the force by measuring the barrier speed or current in the motor and then calculated the force using these measurements.

In some previous systems, capacitive sensor arrangements were used to detect the obstruction in the pathway of the door by detecting the capacitance between a conductive element and the ground. However, in these previous systems, the sensed capacitance between a conductive element and the ground increases above a threshold as the sensor approaches the ground thereby indicating that an "obstruction" existed. Consequently, as the door neared the ground, the capacitance reading would have to be adjusted or discarded because the reading would indicate an obstruction existed, when, in fact, the ground was the "obstruction" being detected. Thus, these previous systems could not be used to detect an obstruction unless the readings were sufficiently adjusted to take into account the detection of the ground or other reference.

SUMMARY OF THE INVENTION

A system and method for determining whether an obstruction is present in the pathway of a movable barrier avoids false detections of obstructions. As a conductive member on the edge of the moveable barrier approaches the ground, a post or some other reference object, the capacitance between the conductive member and its ground is measured. This measured value is maintained at a substantially constant value or held below a threshold as the conductive element approaches the reference. The approach is easy and inexpensive to implement on current moveable barrier systems.

In many of these embodiments, a conductive member is positioned in a holder, which is attached to the moveable barrier. The capacitance is measured between the conductive member and an electrical reference, such as the ground or a fence post. A sensor circuit is coupled to the conductor and determines whether an obstruction exists in the path of the barrier by analyzing the measured capacitance. The conductive member and holder are maintained at a fixed distance from the reference as the conductive member approaches the reference such that the sensed capacitance between the conductive member and its ground remains below a predetermined threshold and/or remains substantially constant.

In one example, the holder and conductive member may move or pivot away from the reference as the holder and conductive member combination approaches the reference. Thus, the sensor circuit does not determine an obstruction exists when the reference is approached.

The movable barrier may be any type of movable barrier, for example, an overhead door, a sliding gate or a swinging gate. The conductive member may be any type of conductive material or object, for example, a wire or rod. The holder may be any type of arrangement that is capable of supporting or holding the conductive member. For example, the holder may be fabricated from a stiff plastic or rubber. Other examples of holders are possible.

Thus, a system and method is provided whereby the capacitance sensed between the conductive member and its ground is maintained at a substantially constant value. Since the capacitance as measured between the conductive member and its ground remains substantially constant (in the absence of a real obstruction), false obstruction readings are avoided. In addition, the sensed capacitance does not have to be altered by the system to take into account the increase in capacitance as the conductive member approaches a reference, such as the physical ground. Furthermore, the system can be easily and inexpensively fabricated and applied to current moveable barrier systems.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful in a commercially feasible embodiment are often not depicted in order to facilitate a less obstructed view of the various embodiments of the present invention.

DESCRIPTION OF THE PREFERRED EMBODIMENTS

For illustrative purposes, the following description refers to a moveable barrier that is a garage door. However, it will be understood by those skilled in the art that the moveable barrier may not only be a garage door but may be any type of barrier such as a fire door, shutter, window, gate. Other examples of barriers are possible.

Figure 1:
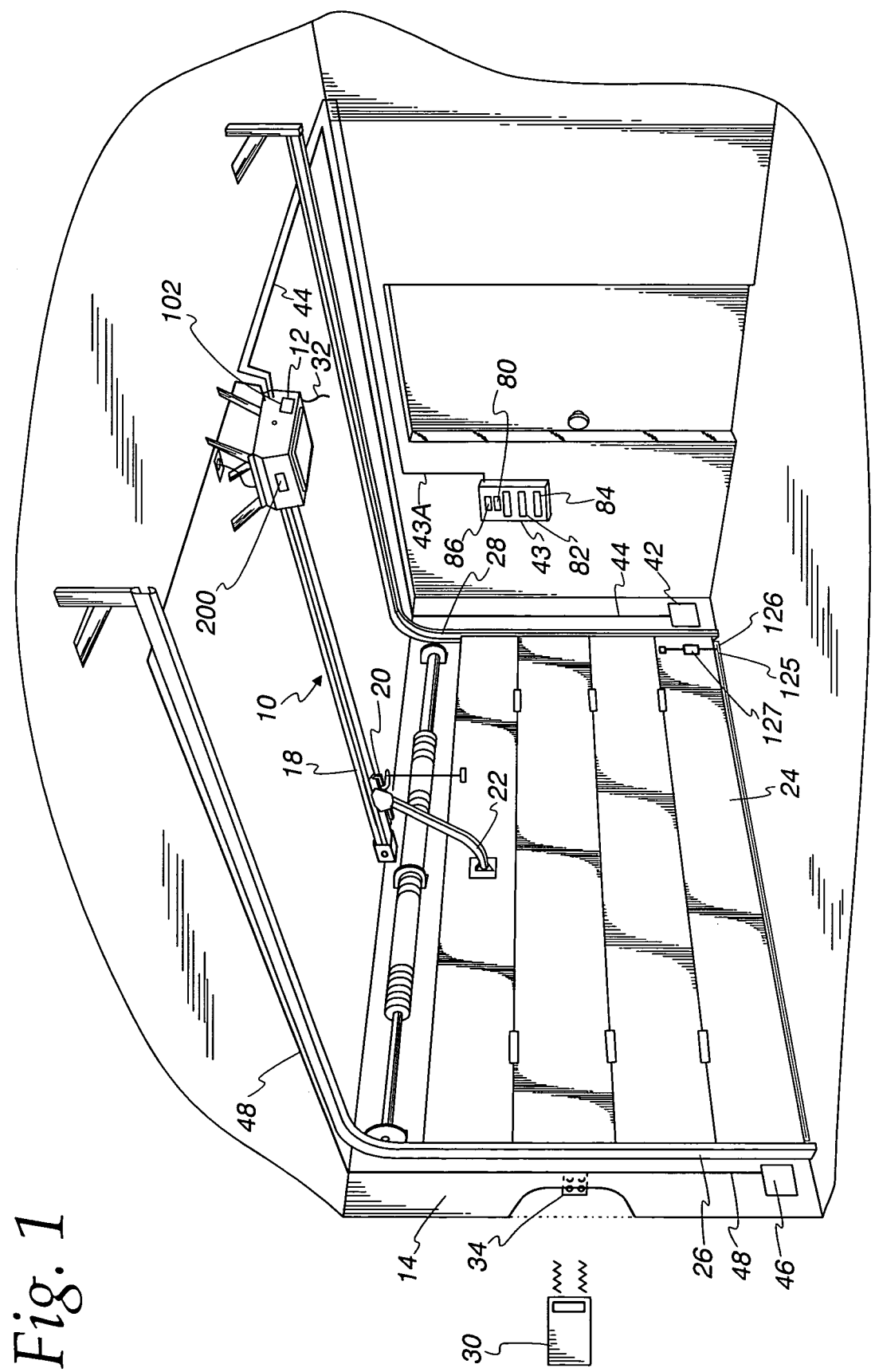
FIG. 1 is a block diagram of a system using a capacitive door edge sensor according to the present invention.

Referring now to the drawings and especially to FIG. 1, a movable barrier operator, which is a garage door operator, is generally shown therein and includes a head unit 12 mounted within a garage 14. More specifically, the head unit 12 is mounted to the ceiling of the garage 14 and includes a rail 18 extending there from with a releasable trolley 20 attached having an arm 22 extending to a multiple paneled garage door 24 positioned for movement along a pair of door rails 26 and 28. The system includes a hand-held transmitter unit 30 adapted to send signals to an antenna 32 positioned on the head unit 12 as will appear hereinafter. An external control pad 34 is positioned on the outside of the garage having a plurality of buttons thereon and communicates via radio frequency transmission with the antenna 32 of the head unit 12. An optical emitter 42 is connected via a power and signal line 44 to the head unit. An optical detector 46 is connected via a wire 48 to the head unit 12. The head unit 12 also includes a receiver unit 102. The receiver unit 102 receives a wireless signal, which is used to actuate the garage door opener.

The door 24 has a conductive member 125 attached. The conductive member 125 may be a wire, rod or the like. The conductive member 125 is enclosed and held by a holder 126. The conductive member 125 is coupled to a sensor circuit 127. The sensor circuit 127 transmits indications of obstructions to the head unit 12. If an obstruction is detected, the head unit 12 can reverse direction of the travel of the door 24.

As the holder 126 enclosing the conductive member 125 approaches the ground, the conductive member 125 is lifted by the holder 126. Thus, the capacitance as measured by the sensor circuit 127 between the conductive member 125 and the ground 126 does not exceed a predetermined threshold and/or remains substantially constant in the absence of an obstruction. Since the capacitance remains substantially constant, a false detection of an obstruction (i.e. the ground 24) is avoided. On the other hand, if a real obstruction were present, the obstruction would be detected and the movement of the door 24 may be halted or the direction of travel of the door 24 may be reversed.

The head unit 12 has the wall control panel 43 connected to it via a wire or line 43A. The wall control panel 43 includes a decoder, which decodes closures of a lock switch 80, a learn switch 82 and a command switch 84 in the wall circuit. The wall control panel 43 also includes a light emitting diode 86 connected by a resistor to the line 43 and to ground to indicate that the wall control panel 43 is energized by the head unit 12. Switch closures are decoded by the decoder, which sends signals along lines 43A to a control unit 200 coupled via control lines to an electric motor positioned within the head unit 12. In other embodiments, analog signals may be exchanged between wall control 43 and head unit The wall control panel 43 is placed in a position such that an operator can observe the garage door 24. In this respect, the control panel 43 may be in a fixed position. However, it may also be moveable as well. The wall control panel 43 may also use a wirelessly coupled connection to the head unit 12 instead of the wire 43A. If an obstruction is detected, the direction of travel of the door 24 may be reversed by the control unit 200.

Figure 2:
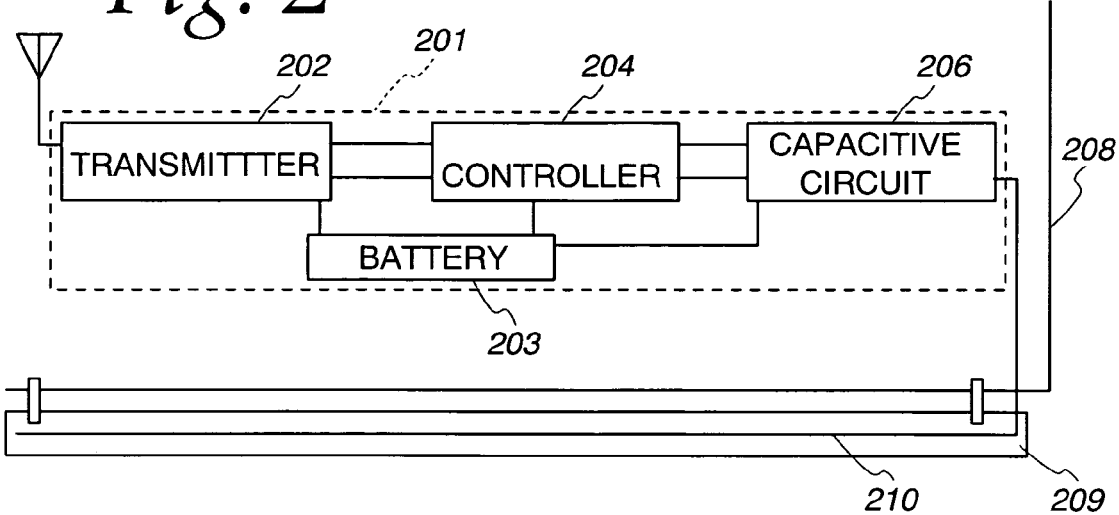
FIG. 2 is a diagram of a capacitive door edge sensor according to the present invention.

Referring now to FIG. 2, one example of a capacitive sensor arrangement is described. A sensing circuit 201 includes a transmitter 202, a controller 204, a capacitive measurement circuit 206, and a battery 203. The battery 203 supplies DC power and current to a conductive member 210.

The device 201 is coupled to a movable barrier 208. The device 201, specifically the capacitive measurement circuit 206 within the device 201, is coupled to the conductive member 210. The capacitive measurement circuit 206 detects changes in capacitance and forwards the information to the controller 204. If a change occurs such that an obstruction is detected, the controller 204 informs the moveable barrier operator by sending a message via the transmitter 202. The moveable barrier operator may stop of reverse direction of the moveable barrier.

The conductive member 210 may be incorporated into a holder 209. The purpose of the holder 209 is to support and retain the conductive member 210. As the holder 209 approaches the ground, for example, the holder 209 pivots in an upward direction. As the holder 209 pivots, the conductive member 210 also pivots. As the conductive member 210 is moved out of the way of the physical ground (or reference), the capacitance between the conductive member 210 to the physical ground (or reference) is held below a predetermined threshold and/or substantially constant as determined by the capacitive measurement circuit 206. Because the conductive member 210 is moved away from the physical ground (or reference), the capacitance as measured between the physical ground (or reference) and the conductive member 210 at the capacitive measurement circuit 206 remains substantially constant and the capacitive measurement circuit 206 does not falsely indicate to controller 204 that there is an obstruction in the way of the movable barrier 208. No adjustment of readings between the conductive member 210 and ground at the capacitive measurement circuit 206 is required. If an obstruction were in the way of the movable barrier 208, then the capacitive measurement circuit 206 would detect the obstruction and relay the detection to the controller 204. The controller 204 would then take an appropriate action, for example stopping and reversing the direction of travel of the moveable barrier 208.

Figure 3A:
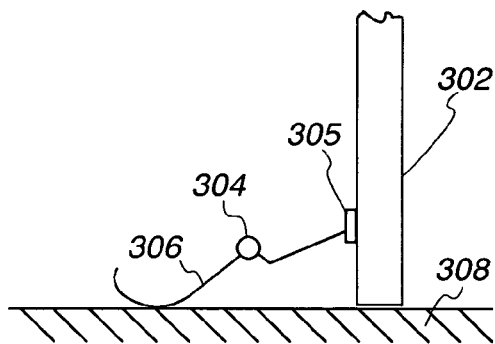
FIGS. 3a-b are diagrams of a capacitive door edge sensor in a garage door arrangement according to the present invention.

Referring to FIG. 3a, an example of a capacitive sensor system for the detection of obstruction is described. A movable barrier 302 rests against the physical ground (or reference) 308. The movable barrier 302 has attached to it a holder 306 for holding in place a conductive member 304 the holder is attached to the movable barrier 302 by a pivoting arrangement 305. In this case, the holder is a non-conductor material and the conductive member is also a wire. As shown in FIG. 3a, it can be seen that as the movable barrier 302 approaches and finally comes to rest against the physical ground (or reference) 308, the conductive member 304 is held above the physical ground (or reference) 308 at a fixed distance. Because the conductive member 304 remains a fixed distance of the ground 308, the capacitance sensed by the conductive member 304 remains below a predetermined threshold and/or substantially constant. A sensor circuit (not shown) coupled to the conductive member 304 avoids the determination that an obstruction is in the pathway of the moveable barrier 302 when, in fact, no obstruction exists. In addition, the measurements made between the conductive member 304 and the ground of the circuit do not have to be compensated to take into account when the conductive member approaches the physical ground (or reference) 308, which is substantially electrically the same as the ground of the circuit.

Figure 3B:
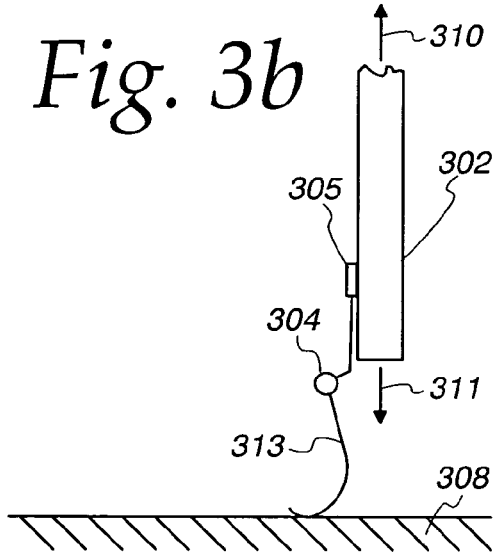

Referring now to FIG. 3b, it is shown that as the barrier moves in an upward direction 310, the holder 306 holding the conductive member 304 falls downward. Conversely, it can be seen that if the barrier 302 were to move in a downward direction 311, a curved end portion 313 of the holder 306 would force the holder 306 into the position shown in FIG. 3a.

Figure 4A:
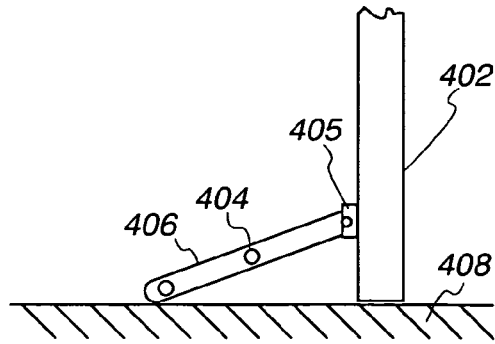
FIGS. 4a-b are diagrams of a capacitive door edge sensor in a garage door system according to the present invention.

Referring now to FIG. 4a, another example of a capacitive sensor system is described. A movable barrier 402 rests against the ground 408. The movable barrier 402 has attached to it a holder flap 406 for holding in place a conductive member 404. The holder flap 406 is attached to the movable barrier 402 by a pivoting arrangement 405 such as a hinge or the like. In this case, the holder flap 406 is a solid rubber flap or similar arrangement that is used to hold the conductive member 404. The conductive member 404 may be a wire, rod or other type of sensing arrangement. As shown in FIG. 4a, as the movable barrier 402 approaches and finally comes to rest against the physical ground (or reference) 408, the conductive 404 is held above the physical ground (or reference) 408 at a fixed distance. Because the conductive member 404 never gets within the fixed distance of the physical ground (or reference) 408, the capacitance sensed by a sensor (not shown) coupled to the conductive member 404 remains below a predetermined threshold and/or substantially constant and the sensor avoids an erroneous determination that an obstruction exists in the path of the moveable barrier 402. In addition, the measurements of the capacitance between the conductive member 404 and the physical ground (or reference) 408 do not have to be altered to take into account when the conductive member approaches the physical ground (or reference) 408.

Figure 4B:
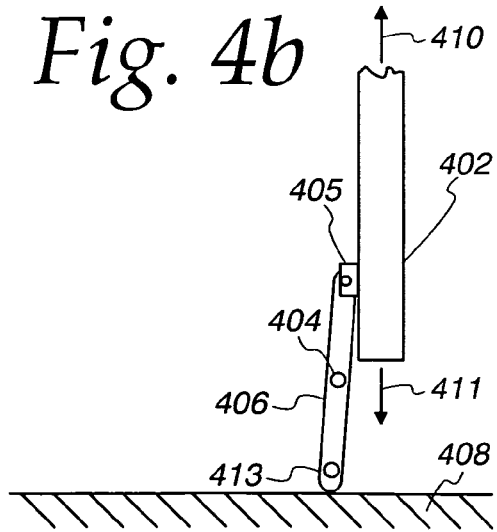

Referring now to FIG. 4b, it is shown that as moveable barrier 402 moves in an upward direction 410, the holder flap 406 falls downward. Conversely, it can be seen that if the moveable barrier 402 were to move in a downward direction 411, the end portion 413 of the holder 406 would force the barrier into the position shown in FIG. 4a.

Figure 5A:
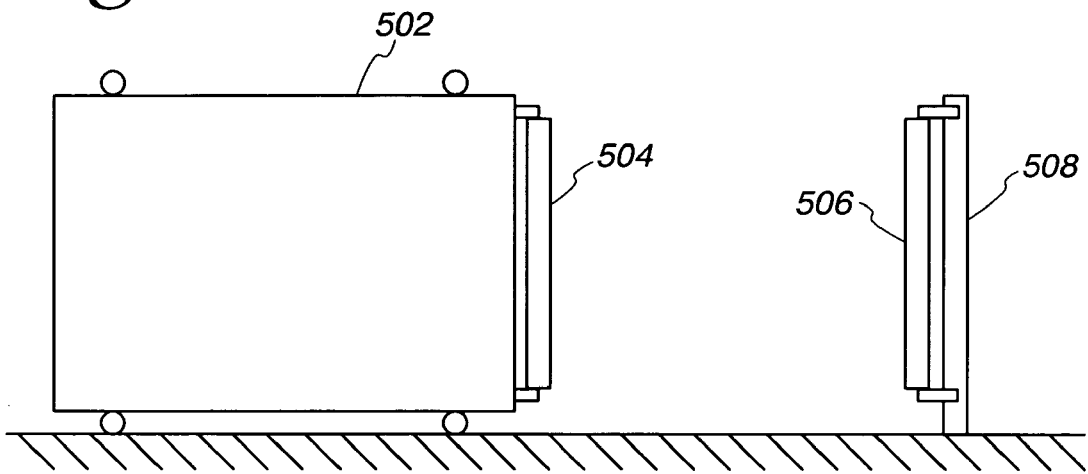
FIGS. 5a-c are diagrams of a capacitive door edge sensor in a swing or sliding door system according to the present invention.
Figure 5B:
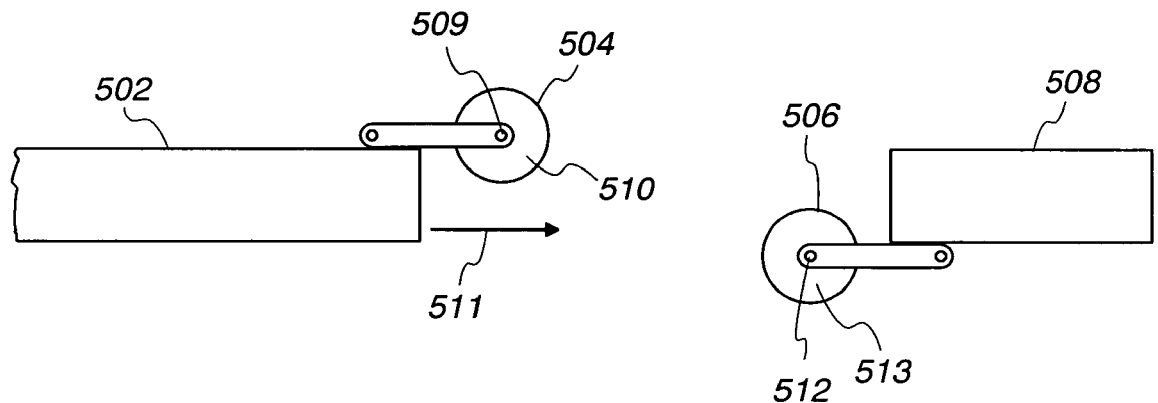
Figure 5C:
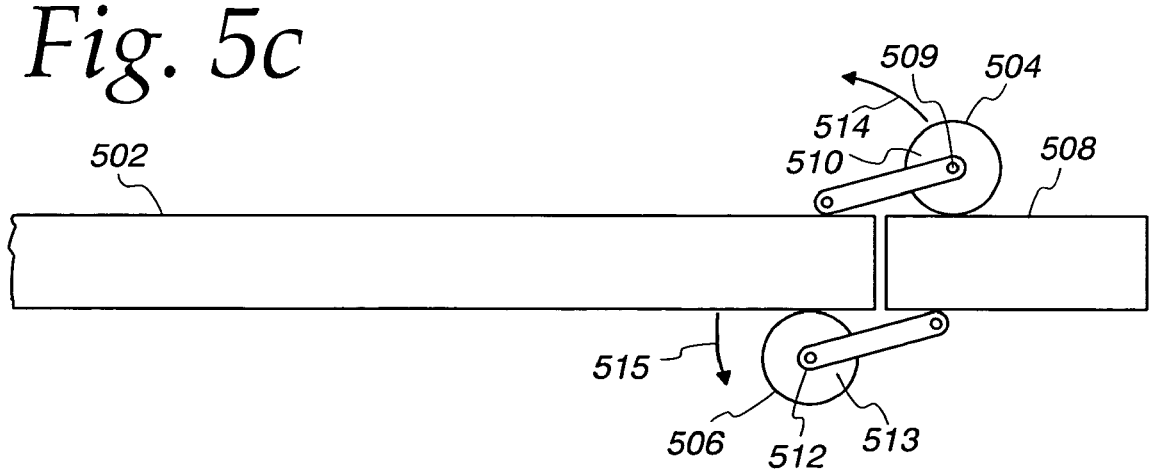

Referring now to FIGS. 5a, 5b and 5c another example of a capacitive sensing system is described. A sliding barrier 502 includes an attached conductive member 504. A post 508 also includes a holder/conductive member 506.

Referring now specifically to FIG. 5b, the sliding barrier 502 moves in direction 511 toward the post 508. The holder/conductive member 504 includes a conductive member 509 and holder 510. Both components are attached to the end of the sliding barrier 502. The holder/conductive member 506 includes a conductive member 512 and a holder 513.

Referring now to FIG. 5c, the holder/conductive member 514 moves away from the post 508 in direction 514 and holder/conductive member 506 moves away from the sliding barrier 502. Thus, the conductive members 512 and 509 are always maintained at a minimum distance away from the sliding barrier 502 and the post 508. Because of this separation, the measured capacitance at a sensor (not shown) between the conductive members 509 and 512 and the post 508 and the gate 512 remains below a predetermined threshold and/or substantially constant, and a false detection of an obstruction with the path of the sliding barrier 502 is avoided. In addition, the sensor measurements do not have to be altered to take into account the approach of the conductive members to a reference.

In another approach, the sliding door 502 can be replaced with a swinging door or gate. In this approach, the other components of the system remain the same. In addition, the system described with respect to FIGS. 5a-c may include only a single holder/conductive member arrangement instead of the twin conductive members as shown in these examples.

While there has been illustrated and described particular embodiments of the present invention, it will be appreciated that numerous changes and modifications will occur to those skilled in the art, and it is intended in the appended claims to cover all those changes and modifications which fall within the true scope of the present invention.

What is claimed is:

1. A system for determining a capacitance at an edge of a movable barrier and detecting an obstruction comprising:
   a holder disposed on the moveable barrier;
   a conductive member positioned with the holder;
   a controller coupled to the conductive member, the controller determining whether an obstruction exists within a path of movement between open and closed positions of the barrier, the controller responsive to and detecting a change in sensed capacitance, the capacitance sensed between the conductive member and a reference that is separated from the moveable barrier, the reference being in a fixed position and minimum distance relative to the moveable barrier; and
   wherein the holder prohibits the conductive member from achieving a distance from the reference which is less than a predetermined distance as the reference is approached by the barrier such that the sensed capacitance between the reference and the conductive member remains below a predetermined level.

2. The system of claim 1 wherein the movable barrier is selected from the group consisting of a garage door, a sliding gate, and a swinging door.

3. The system of claim 1 wherein the conductive member comprises a wire.

4. The system of claim 3 wherein the holder comprises a rubber flap.

5. The system of claim 1 wherein the conductive member comprises a rod.

6. The system of claim 1 wherein the reference is selected from the group consisting of ground, a fence post, and a gate structure.

7. A method for determining whether an obstruction exists in a pathway of a movable barrier comprising:
   moving a movable barrier;
   determining a capacitance between a conductive member and a reference as the movable barrier is moved, the conductive member mounted on the movable barrier, the reference separated from the movable barrier, and in a fixed position and minimum distance relative to the moveable barrier;
   determining whether an obstruction exists in a pathway of the movable barrier based upon the capacitance; and
   maintaining the conductive member at the minimum distance from the reference as the conductive member approaches the reference so as to maintain a substantially uniform sensed capacitance between the conductive member and the reference in the absence of an obstruction.

8. The method of claim 7 wherein the step of maintaining the conductive member comprises moving a flap with the conductive member located within the flap away from the ground.

9. The method of claim 7 wherein the step of maintaining the conductive member comprises moving the conductive member away from the post of a gate.

10. The method of claim 7 wherein moving a movable barrier comprises moving a garage door.

11. The method of claim 7 wherein moving a movable barrier comprises moving a sliding gate.

12. The method of claim 7 wherein moving a movable barrier comprises moving a swinging gate.

13. A system for determining a capacitance at an edge of a movable barrier and detecting an obstruction comprising:
   a holder;
   a conductive member positioned with the holder for measuring the capacitance between the conductive member and a reference that is separated from the moveable barrier, the reference being in a fixed position and minimum distance relative to the moveable barrier;
   a controller coupled to the conductive member and the holder, the controller is programmed and arranged to communicate with the conductive member such that the capacitance measured between the conductive member and the reference is held at a substantially constant value in the absence of an obstruction as the moveable barrier approaches the reference.

14. The system of claim 13 wherein the conductive member comprises a wire.

15. The system of claim 14 wherein the holder comprises a rubber flap.

16. The system of claim 13 wherein the conductive member comprises a rod.

17. The system of claim 13 wherein the reference is selected from a the group consisting of ground, a fence post, and a gate structure.

18. The system of claim 13 further comprising a DC power source coupled to the conductor member for supplying DC current and power to the conductive member.

19. A method for determining whether an obstruction exists in a pathway of a movable barrier comprising:
   moving a movable barrier in a downward direction;
   determining a capacitance between a conductive member and the ground as the movable barrier is moved in the downward direction towards the ground, the conductive member mounted on the movable barrier;
   determining whether an obstruction exists in a pathway of the movable barrier based upon the capacitance; and
   maintaining the conductive member at a minimum distance from the ground as the conductive member approaches the ground so as to maintain a substantially uniform sensed capacitance between the conductive member and the ground in the absence of an obstruction.

20. The method of claim 19 wherein the step of maintaining the conductive member comprises moving a flap with the conductive member located within the flap away from the ground.

21. The method of claim 19 wherein moving a movable barrier comprises moving a garage door.

* * * * *

UNITED STATES PATENT AND TRADEMARK OFFICE
CERTIFICATE OF CORRECTION

PATENT NO. : 7,420,347 B2
APPLICATION NO. : 10/958181
DATED : September 2, 2008
INVENTOR(S) : James J. Fitzgibbon It is certified that error appears in the above-identified patent and that said Letters Patent is hereby corrected as shown below:

Claim 17, Column 7, Line 24; After "from" delete "a"

Signed and Sealed this

Sixth Day of January, 2009

JON W. DUDAS
*Director of the United States Patent and Trademark Office*